United States Patent [19]

Hinooka

[11] Patent Number: 5,105,101

[45] Date of Patent: Apr. 14, 1992

[54] TRIMMING CODE SETTING CIRCUIT HAVING HIGH RELIABILITY

[75] Inventor: Kiyonobu Hinooka, Tokyo, Japan

[73] Assignee: NEC Corporation, Tokyo, Japan

[21] Appl. No.: 638,897

[22] Filed: Jan. 8, 1991

[30] Foreign Application Priority Data

Jan. 8, 1990 [JP] Japan .................................. 2-1851

[51] Int. Cl.⁵ .................................................. H03K 3/01
[52] U.S. Cl. .................................. 307/296.6; 307/355; 307/491
[58] Field of Search ............. 307/296.6, 491, 494, 307/355, 362, 202.1

[56] References Cited

U.S. PATENT DOCUMENTS

| 4,317,054 | 2/1982 | Caruso | 307/355 |
| 4,754,169 | 6/1988 | Morris | 307/355 |
| 4,757,216 | 7/1988 | Tanahashi | 307/355 |
| 4,760,287 | 7/1988 | Goto | 307/355 |
| 4,845,383 | 7/1989 | Iida | 307/355 |

FOREIGN PATENT DOCUMENTS 0219223 9/1988 Japan .................................. 307/491

Primary Examiner—Eugene R. Laroche
Assistant Examiner—A. Zarabian
Attorney, Agent, or Firm—Helfgott & Karas

[57] ABSTRACT

A semiconductor integrated circuit has a trimming code setting circuit so configured that a desired trimming code is set dependently upon whether or not a thin film resistor is cut. The trimming code setting circuit comprises first and second ratio circuits each of which includes a P-channel transistor having a source connected to a high voltage line and a drain connected through a thin film resistor to a low voltage line. A gate of the P-channel transistor is biased to allow a predetermined current to flow through the thin film resistor and a source-drain of the transistor and the thin film resistor forms a voltage output node. The voltage output node of each of the first and second ratio circuits is connected to a comparator, which in turn outputs a logical signal determined on the basis of whether or not the voltage on the voltage output node of the first ratio circuit is higher than the voltage on the voltage output node of the second ration circuit. The integrated circuit further includes a current setting circuit having a first MOS transistor and a current mirror circuit having a second MOS transistor, the gate of which is connected to the gate of the first MOS transistor.

3 Claims, 1 Drawing Sheet

TRIMMING CODE SETTING CIRCUIT HAVING HIGH RELIABILITY

BACKGROUND OF THE INVENTION

1. Field of the Invention

The present invention relates to a semiconductor integrated circuit, and more specifically to a semiconductor integrated circuit having a trimming code setting circuit.

2. Description of Related Art

In general, in case of setting a reference voltage value or a circuit current value for an analog circuit and other circuits in a semiconductor integrated circuit, a very severe value has often been required as a catalog standard or specification. In such a case, a so-called "trimming code setting circuit" has been required in order to cause the reference voltage value or the circuit current value to be within a range defined by the catalog standard or specification.

For example, one typical trimming code setting circuit, which is incorporated in a semiconductor integrated circuit and which the inventor is aware of, incudes a current setting circuit composed a P-channel MOS transistor having a source connected to a first high voltage supply line $V_{DD}$ (for example +5 V) and a drain connected through a constant current source to a first low voltage supply line $V_{SS}$ (for example, −5 V). A gate of the P-channel MOS transistor is connected to the drain of the P-channel MOS transistor itself.

The gate of the P-channel MOS transistor of the current setting circuit is connected to a plurality of trimming code setting circuits. Each of the trimming code setting circuits includes a P-channel MOS transistor having a source connected to a second high voltage supply line $V_{DD}$ (for example +5 V) and a drain connected through a thin film resistor to a second low voltage supply line $V_{SS}$ (for example, −5 V). A gate of the P-channel MOS transistor of each trimming code setting circuit is connected commonly to the gate of the P-channel MOS transistor of the current setting circuit. Therefore, the P-channel MOS transistor of each trimming code setting circuit constitutes a mirror circuit for the P-channel MOS transistor of the current setting circuit. A connection node between the thin film resistor and the drain of the P-channel MOS transistor is of each trimming code setting circuit connected to an input of and inverter, which in turn has an output for supplying a unitary code signal to a predetermined decoder. Therefore, a circuit composed of the P-channel MOS transistor and the thin film resistor of each trimming code setting circuit is connected in parallel to a circuit compossed of the P-channel MOS transistor and the thin film resistor of the other trimming code setting circuit or circuits.

Here, since the trimming code setting circuits has the same construction, explanation of function and operation will be made on only one of the trimming code setting circuits. As mentioned above, since the P-channel MOS transistor of each trimming code setting circuit is connected in the form of a mirror circuit for the P-channel MOS transistor of the current setting circuit, a predetermined current defined by the constant current source of the current setting circuit will flow through the P-channel MOS transistor of each trimming code setting circuit. Therefore, the series-connected circuit formed of the P-channel MOS transistor and the thin film resistor of each trimming code setting circuit constitutes a so-called ratio circuit.

In ordinary cases, the thin film resistor is formed to have a resistance smaller than an ON resistance of the P-channel MOS transistor when the thin film resistor has not yet been cut off. Therefore, when the thin film resistor has not yet been trimmed, namely when the thin film resistor has not been cut off, a drain potential of the P-channel MOS transistor of the trimming code setting circuit is sufficiently lower than a logical threshold voltage of the associated inverter, so that the associated inverter generates a high level signal to the associated decoder.

On the other hand, when the thin film resistor has been cut off, the drain potential of the P-channel MOS transistor of the trimming code setting circuit becomes higher than the logical threshold voltage of the associated inverter, so that the associated inverter generates a low level signal to the associated decoder.

As seen from the above, the trimming code can be set dependently upon whether the thin film resistor is cut off or not. Namely, the inverter of the trimming code setting circuit having an uncut thin film resistor outputs a low level signal, and the inverter of the trimming code setting circuit having a cutoff thin film resistor outputs a high level signal. Thus, a plurality of trimming code setting circuits cooperate to generate a plural-bit trimming code as a whole.

Incidently, the cutoff of the thin film resistor is attained by causing a current to flow through a thin film resistor to be cut off so that the thin film resistor is fused off, or by cutting the thin film resistor to be cut off by means of a laser beam. In the former case, the drain of the P-channel transistor associated to the thin film resistor is previously connected to a pad formed of for example aluminum, and in a wafer testing process using for example a tester, a voltage is applied between the low voltage supply terminal and a pad connected to the drain of the P-channel transistor associated to a thin film resistor to be cut off, so that the thin film resistor is cut off by a electric current flowing through the thin film resistor itself.

In the semiconductor integrated circuit incorporating therein the above mentioned trimming code setting circuit, once that the trimming code has been set, the trimming code has to be premanently constant in a proper operation of the semiconductor integrated circuit after the trimming code has been set. In other words, a high degree of reliability is required. in practice, however, it is some cases that the cutoff of the thin film resistor is incomplete, and in the way of the operation of the semiconductor integrated circuit, the trimming code becomes defective or faulty. This is one important cause lowering the reliability of the semiconductor integrated circuit.

SUMMARY OF THE INVENTION

Accordingly, it is an object of the present invention to provide a trimming code setting circuit which has overcome the defect of the above mentioned one.

Another object of the present invention is to provide a trimming code setting circuit capable of generating a trimming code even if cutoff of a thin film resistor is incomplete The above and other objects of the present invention are achieved in accordance with the present invention by a semiconductor integrated circuit having a trimming code setting circuit so configured that a desired trimming code is set dependently upon whether or not a thin film resistor is cut, the trimming code setting circuit comprising:

first and second ratio circuits each of which includes a transistor having a main current path connected in series with a thin film resistor in such a manner that a series circuit composed of the thin film resistor and the main current path of the transistor is connected at its one end to a high voltage side and at its other end to a low voltage side, the transistor being biased to allow a predetermined current to flow through the series circuit composed of the thin film resistor and the main current path of the transistor, a connector node between the main current path of the transistor and the thin film resistor forming a voltage output node, and means connected to the voltage output node of each of the first and second ratio circuits for comparing a voltage on the voltage output node of the first ratio circuit with a voltage on the voltage output node of the second ratio circuit, the means operating to output a logical signal determined on the basis of whether or not the voltage on the voltage output node of the first ratio circuit is higher than the voltage on the voltage output node of the second ratio circuit.

In the case that the transistor is formed of a MOS transistor, the main current path is formed of a source-drain current path of the MOS transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
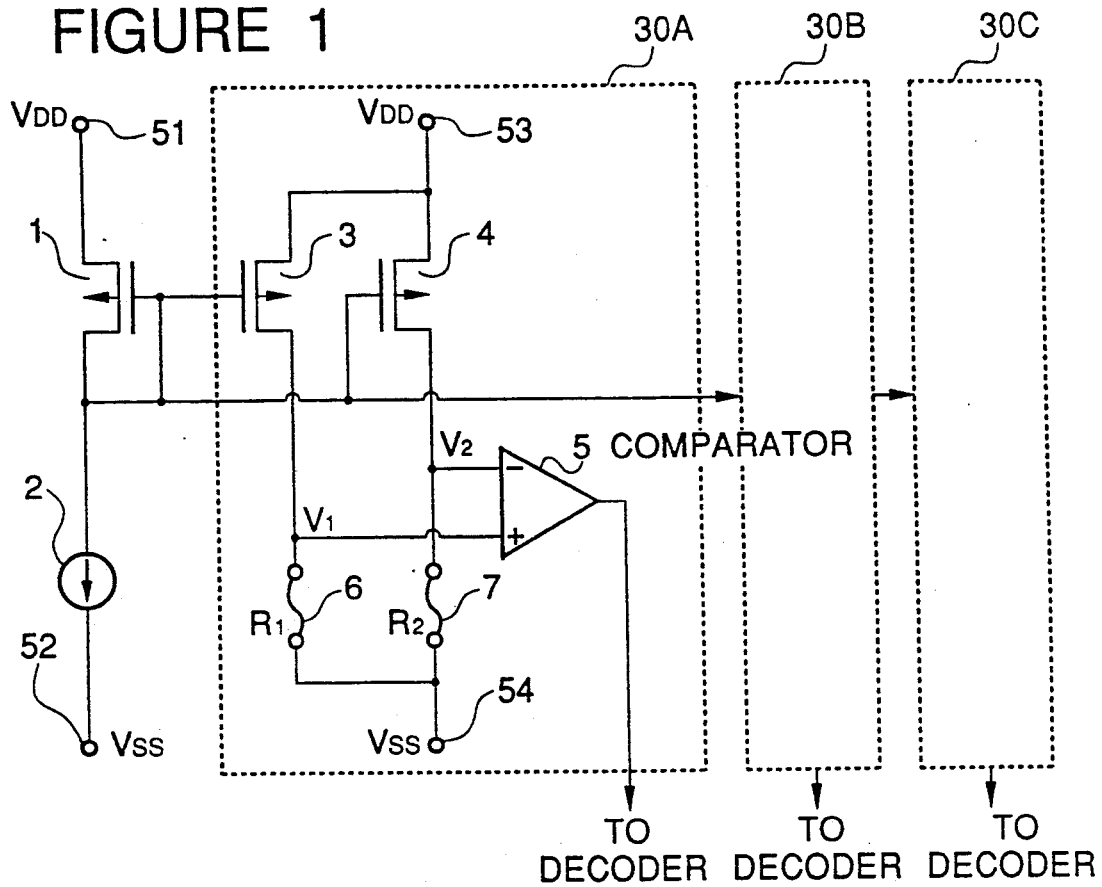
FIG. 1 is a circuit diagram of a first embodiment of the trimming code setting circuit in accordance with the present invention.

Referring to FIG. 1, there is shown a circuit diagram of a first embodiment of the trimming code setting circuit in accordance with the present invention and a circuit associated with the trimming code setting circuit, which circuits are incorporated in a semiconductor integrated circuit.

In FIG. 1, three trimming code setting circuits 30A, 30B and 30C are shown. Since these trimming code setting circuits have the same circuit construction, an internal circuit of only the trimming code setting circuit 30A is shown and described on construction and on operation. In addition, since the three trimming code setting circuits 30A, 30B and 30C are provided, the shown circuit can generate three bits of trimming code. If only one bit of trimming code is required, the trimming code setting circuits 30B and 30C are omitted. On the other hand, if more than three bits of trimming code are required, a required number of trimming code setting circuit having the same circuit construction as the trimming code setting circuit 30A are added in parallel to the trimming code setting circuit 30A.

The shown circuit also includes a current setting circuit composed of a P-channel MOS transistor 1 having a source connected to a first high voltage supply terminal $V_{DD}$ 51 (for example +5 V) and a drain connected through a constant current source 2 to a first low voltage supply terminal $V_{SS}$ 52 (for example, −5 V). A gate of the P-channel MOS transistor 1 is connected to the drain of the P-channel MOS transistor 1 itself.

The trimming code setting circuit 30A includes a pair of ratio circuits. A first ratio circuit is composed of a P-channel MOS transistor 3 having a source connected to as second high voltage supply terminal $V_{DD}$ 53 (for example +5 V) and a drain connected through a thin film resistor 6 to a second low voltage supply line $V_{SS}$ 54 (for example, −5 V). A gate of the P-channel MOS transistor 3 is connected to the gate of the P-channel MOS transistor 1 of the current setting circuit. A second ratio circuit is composed of a P-channel MOS transistor 4 having a source connected to the second high voltage supply terminal $V_{DD}$ 53 and a drain connected through a thin film resistor 7 to the second low voltage supply line $V_{SS}$ 54. A gate of the P-channel MOS transistor 4 is connected to the gate of the P-channel MOS transistor 1 of the current setting circuit.

As seen from the above description and from FIG. 1, each of the P-channel MOS transistors 3 and 4 constitutes a current mirror circuit for the P-channel MOS transistor 1 of the current setting circuit.

A connection node between the thin film resistor 6 and the drain of the P-channel MOS transistor 3 is connected to a non-inverting input of a comparator 5. A connection node between the thin film resistor 7 and the drain of the P-channel MOS transistor 4 is connected to an inverting input of the comparator 5. The comparator 5 has an output for supplying a unitary code signal to a decoder not shown.

In the above mentioned circuit, a resistance $R_1$ of the thin film resistor 6 and a resistance $R_2$ of the thin film resistor 7 are set to fulfil the following relation $$R_1 > R_2 \tag{1}$$

The setting of the trimming code in the above mentioned circuit is achieved dependently upon whether the thin film resistor 7 is cut off or not. First, consider the case in which the thin film resistor 7 is not cut off. As mentioned above, since each of the P-channel MOS transistors 3 and 4 is connected in the form of a mirror circuit to a the P-channel MOS transistor 1, each of the P-channel MOS transistors 3 and 4 is controlled to flow the same amount of current defined by the constant current source 2. Accordingly, since it is set that $R_1 > R_2$ as mentioned above, a following equation is established between a drain potential $V_1$ of the P-channel MOS transistor 3 and a drain potential $V_2$ of the P-channel MOS transistor 4:

$$V_1 > V_2 \tag{2}$$

As mentioned above, since the drain potential $V_1$ of the P-channel MOS transistor 3 and the drain potential $V_2$ of the P-channel MOS transistor 4 are connected to the non-inverting input and the inverting input of the comparator 5, respectively, a voltage difference between $V_1$ and $V_2$ is emphasized by the comparator 5, and the comparator 5 outputs a high level signal as one bit of trimming code.

On the other hand, if the thin film resistor 7 is cut off, a following equation is established between the drain potential $V_1$ of the P-channel MOS transistor 3 and the drain potential $V_2$ of the P-channel MOS transistor:

$$V_1 < V_2 \tag{3}$$

Therefore, the comparator 5 outputs a low level signal as one bit of trimming code.

In general, the constant current source is set to flow a constant current on the order of 10 μA for the purpose of saving a consumption current. In the conventional circuit therefore, if a leakage current of not less than 10 μA flows through the cutoff thin film resistor, a trimming code changes, with the result that it is judged to be a fault. In other words, if a leakage resistance of the cutoff thin film resistor becomes less than 500KΩ, the semiconductor integrated circuit is discriminated to be defective.

In the trimming code setting circuit in accordance with the present invention, on the other hand, even if a leakage current occurs in the cutoff thin film resistor 7, the semiconductor integrated circuit is not discriminated to be defective unless the leakage resistance of the cutoff thin film resistor 7 becomes smaller than the resistance of the thin film resistor 6. In ordinary cases, since a thin film resistor of the ratio circuit is set to have a resistance on the order of 100 Ω, unless the leakage resistance of the cutoff thin film resistor 7 becomes 100 Ω or less, the semiconductor integrated circuit is not discriminated to be defective.

This means that the semiconductor integrated circuit in accordance with the present invention is not discriminated to be defective unless there flows a leakage current 5000 times as large as the leakage current which has caused to be discriminated to be defective in the conventional example. However, the resistance of the incomplete cutoff thin film resistor will in no way become lower than 100 106, and therefore, the semiconductor integrated circuit in accordance with the present invention never becomes defective in the way of an operation of the semiconductor integrated circuit.

Figure 2:
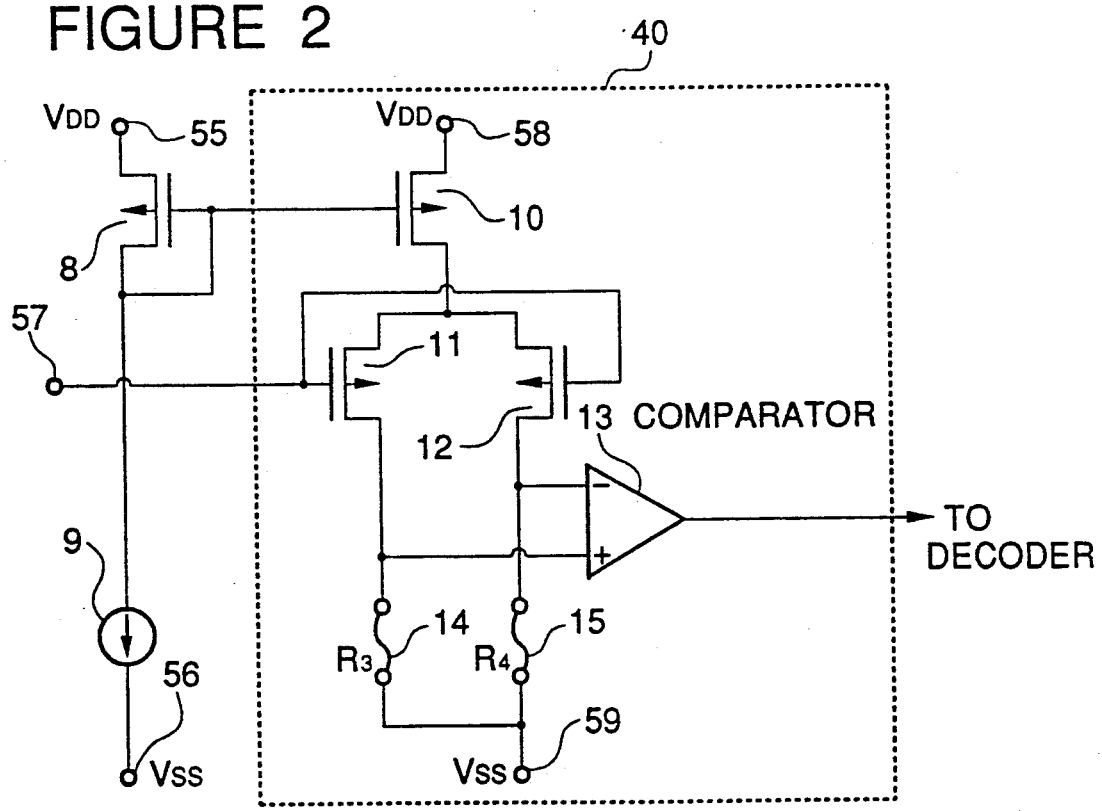
FIG. 2 is a circuit diagram of a second embodiment of the trimming code setting circuit in accordance with the present invention.

Turning to FIG. 2, there is shown a circuit diagram of a second embodiment of the trimming code setting circuit in accordance with the present invention and a circuit associated with the trimming code setting circuit, which circuit are incorporated in a semiconductor integrated circuit.

The showing circuit includes a current setting circuit composed a P-channel MOS transistor 8 having a source connected to a first high voltage supply terminal $V_{DD}$ 55 and a drain connected through a constant current source 9 to a first low voltage supply terminal $V_{SS}$ 56. A gate of the P-channel MOS transistor 8 is connected to the drain of the P-channel MOS transistor 8 itself.

The shown circuit also includes one trimming code setting circuit 40, which in turn includes a P-channel MOS transistor 10 having a source connected to a second high voltage supply terminal $V_{DD}$ 58 and a gate connected to the gate of the P-channel MOS transistor 8. Therefore, the P-channel MOS transistor 10 constitutes a current mirror circuit for the P-channel MOS transistor 8 of the current setting circuit. A drain of the P-channel MOS transistor 10 is connected to a differential amplifier circuit, which is composed of a P-channel MOS transistor 11 having a source connected to the drain of the P-channel MOS transistor 10 and a drain connected through a thin film resistor 14 to a second low voltage supply line $V_{SS}$ 59, and another P-channel MOS transistor 12 having a source connected to the drain of the P-channel MOS transistor 10 and a drain connected through a thin film resistor 15 to the second low voltage supply line $V_{SS}$ 59. Gates of the P-channel MOS transistor 11 and 12 are connected in common to a predetermined voltage terminal 57.

A connection node between the thin film resistor 14 and the drain of the P-channel MOS transistor 11 is connected to a non-inverting input of a comparator 13. A connection node between the thin film resistor 15 and the drain of the P-channel MOS transistor 12 is connected to an inverting input of the comparator 13. The comparator 13 has an output for supplying a unitary code signal to a decoder not shown.

Similarly to the first embodiment, a resistance $R_3$ of the thin film resistor 14 and a resistance $R_3$ of the thin film resistor 15 are set to fulfil the following relation:

$$R_3 > R_4 \tag{4}$$

The setting of the trimming code in this second embodiment is achieved dependently upon whether the thin film resistor 15 is cut off or not.

Since the second embodiment operates similarly to the first embodiment, description of an operation of the second embodiment will be omitted. However, it should be noted that since the P-channel MOS transistors 11 and 13 form a differential amplifier having a corresponding gain, stability of the trimming code setting circuit is further enhanced by cooperation of the amplification function of the comparator and the amplification function of the differential amplifier.

The invention has thus been shown and described with reference to the specific embodiments. However, it should be noted that the present invention is in no way limited to the details of the illustrated structures but changes and modifications may be made within the scope of the appended claims

What is claimed is:

1. A semiconductor integrated circuit comprising:
a trimming code setting circuit so configured that a desired trimming code is set dependently upon whether or not a thin film resistor is cut, the trimming code setting circuit including first and second ratio circuits each of which includes a transistor having a main current path connected in series with a thin film resistor in such a manner that a series circuit composed of said thin film resistor and said main current path of said transistor is connected at its one end to a high voltage side and at its other end to a low voltage side, said transistor being biased to allow a predetermined current to flow through said series circuit composed of said thin film resistor and said main current path of said transistor, a connection node between said main current path of said transistor and said thin film resistor forming a voltage output node, and means connected to said voltage output node of each of said first and second ratio circuits for comparing a voltage on said voltage output node of said first ratio circuit with a voltage on said voltage output node of said second ratio circuit, said means operating to output a logical signal determined on the basis of whether or not said voltage on said voltage output node of said first ratio circuit is higher than the voltage on said voltage output node of said second ratio circuit;
a current setting circuit composed of a first MOS transistor having a main current path connected at its one end to a first high voltage supply terminal and at its other end through a constant current source to a first low voltage supply terminal, a gate of said first MOS transistor being connected to an end of said main current path of said first MOS transistor; and a current mirror circuit composed of a second MOS transistor having a gate connected to said gate of said first MOS transistor of said current setting circuit and having a main current path connected at its one end to a second high voltage supply terminal, and wherein said transistor of each of said first and second ratio circuits is as MOS transistor having a gate connected to receive a predetermined voltage, and said one end of said main current path of said transistor of each of said first and second ratio circuits is connected to the other end of said main current path of said second MOS transistor of said current mirror circuit.

2. A semiconductor integrated circuit claimed in claim 1 wherein said means is composed of a comparator having a non-inverting input connected to a connection node of said thin film resistor and said MOS transistor of said first ratio circuit and an inverting input connected to a connection node of said thin film resistor and said MOS transistor of said second ratio circuit.

3. A semiconductor integrated circuit claimed in claim 2 wherein said thin film resistor of said first ratio circuit is a fixed resistor which has a resistance higher than that of said thin film resistor of said second ratio circuit when said thin film resistor of said second ratio circuit is untrimmed so that after said thin film resistor of said second ratio circuit is trimmed, the resistance of said thin film resistor of said first ratio circuit becomes smaller than that of the trimmed thin film resistor of said second ratio circuit.

* * * * *